United States Patent
Wu et al.

(10) Patent No.: US 10,651,296 B2
(45) Date of Patent: May 12, 2020

(54) METHODS OF FABRICATING FIN FIELD EFFECT TRANSISTOR (FINFET) DEVICES WITH UNIFORM TENSION USING IMPLANTATIONS ON TOP AND SIDEWALL OF FIN

(71) Applicant: TAIWAN SEMICONDUCTOR MANUFACTURING CO., LTD., Hsinchu (TW)

(72) Inventors: Tsung-Han Wu, Tainan (TW);
Tong-Min Weng, Taoyuan (TW);
Chun-Yi Huang, Hsinchu (TW);
Po-Ching Lee, Hsinchu (TW);
Chih-Hsuan Hsieh, Hsinchu (TW);
Shu-Ching Tsai, Pingtung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/048,904

(22) Filed: Jul. 30, 2018

(65) Prior Publication Data
US 2020/0035815 A1    Jan. 30, 2020

(51) Int. Cl.
*H01L 29/66* (2006.01)
*H01L 29/78* (2006.01)
*H01L 21/02* (2006.01)
*H01L 21/324* (2006.01)
*H01L 21/265* (2006.01)

(52) U.S. Cl.
CPC .. *H01L 29/66803* (2013.01); *H01L 21/02164* (2013.01); *H01L 21/02236* (2013.01); *H01L 21/26586* (2013.01); *H01L 21/324* (2013.01); *H01L 29/7851* (2013.01)

(58) Field of Classification Search
CPC ............ H01L 29/66803; H01L 21/324; H01L 29/7851
See application file for complete search history.

(56) References Cited

U.S. PATENT DOCUMENTS

| | | | | |
|---|---|---|---|---|
| 9,159,810 B2* | 10/2015 | Tang | ...................... | H01L 29/785 |
| 2008/0050897 A1* | 2/2008 | Kottantharayil | ............................ | H01L 29/66803 438/513 |
| 2013/0183804 A1* | 7/2013 | Wang | ................ | H01L 29/66803 438/285 |

* cited by examiner

*Primary Examiner* — Quoc D Hoang
(74) *Attorney, Agent, or Firm* — Birch, Stewart, Kolasch & Birch, LLP

(57) ABSTRACT

Methods of fabricating FinFET devices are provided. The method includes forming a fin over a substrate. The method also includes implanting a first dopant on a top surface of the fin and implanting a second dopant on a sidewall surface of the fin. The first dopant is different from the second dopant. The method further includes forming an oxide layer on the top surface and the sidewall surface of the fin, and forming a gate electrode layer over the oxide layer.

20 Claims, 14 Drawing Sheets

US 10,651,296 B2

METHODS OF FABRICATING FIN FIELD EFFECT TRANSISTOR (FINFET) DEVICES WITH UNIFORM TENSION USING IMPLANTATIONS ON TOP AND SIDEWALL OF FIN

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a substrate, and patterning the various material layers using lithography to form circuit components and elements on the substrate.

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins protruding from the substrate and in which channel and source/drain regions are formed. A gate is formed over the top surface and along the sides of the fin structure (e.g., wrapping) utilizing the advantage of the increased surface area of the channel to produce faster, more reliable, and better-controlled semiconductor transistor devices. However, new challenges are presented by such fin structures.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
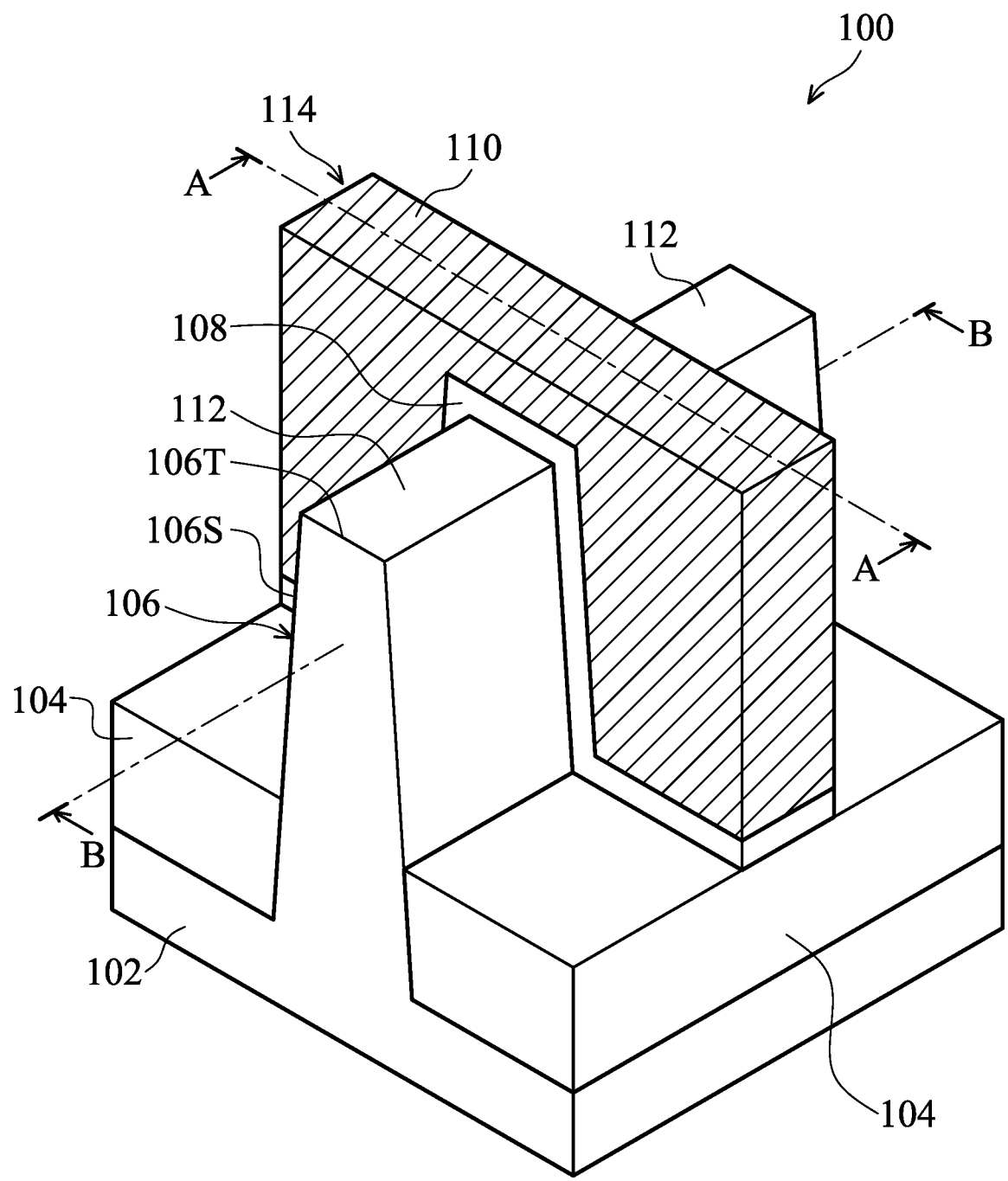
FIG. 1 shows a perspective view of a Fin Field Effect Transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional blocks can be provided before, during, and after the method, and some of the blocks described can be replaced, exchanged or eliminated for other embodiments of the method.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments disclosed herein relate generally to fabricating Fin Field Effect Transistor (FinFET) devices using implantations on the top surface and on the sidewall surface of a fin and to structures formed thereby. In some embodiments, the implantations are performed with different dopants on the top surface and the sidewall surface of the fin to regulate the tensions at the top surface and the sidewall surface of the fin to be uniform. The dopant implanted on the top surface of the fin has a smaller atomic radius than the material of the fin. The dopant implanted on the sidewall surface of the fin has a larger atomic radius than the material of the fin. In some embodiments, the material of the fin includes silicon. The dopant implanted on the top surface of the fin has a smaller atomic radius than silicon, and the dopant implanted on the sidewall surface of the fin has a larger atomic radius than silicon. The implantations performed on the top surface and the sidewall surface of the fin with the above-mentioned different dopants can obtain uniform tension between the top surface and the sidewall surface of the fin. The uniform tension between the top surface and the sidewall surface of the fin can achieve well-controlled carrier mobility in the fin of the FinFET device. Therefore, the FinFET device can have well-controlled saturation current (Isat) and well-controlled threshold voltage (Vth).

In some embodiments, the implantations are performed on the top surface and the sidewall surface of the fin respectively with different dopants to regulate the thicknesses of an oxide layer formed on the top surface and the sidewall surface of the fin to be uniform. The dopant implanted on the top surface of the fin has the ability to inhibit oxidation of the fin or the ability to inhibit oxide formation on the fin. The dopant implanted on the sidewall surface of the fin has the ability to accelerate oxidation of the fin or the ability to accelerate oxide formation on the fin. The implantations performed on the top surface and the sidewall surface of the fin with the above-mentioned different dopants can obtain uniform thickness of the oxide layer between the top surface and the sidewall surface of the fin. The uniform thickness of the oxide layer between the top surface and the sidewall surface of the fin can make the breakdown voltage of the FinFET device be well-controlled and reduce leakage current of the FinFET device. Therefore, the reliability of the FinFET device is improved.

The foregoing broadly outlines some aspects of the embodiments described herein. Some embodiments described herein are described in the context of FinFET devices, and more particularly, in the context of regulation of tension and oxide thickness on the top surface and the sidewall surface of a fin for FinFET devices. Some variations of the exemplary methods and structures are described. A person having ordinary skill in the art will readily understand other modifications may be made that are contemplated within the scope of other embodiments. Although embodiments of the method may be described in a particular order, various other embodiments of the method may be performed in any logical order and may include fewer or more steps than what is described herein.

Embodiments for fabricating FinFET devices are provided. FIG. 1 shows a perspective view of a FinFET device 100, in accordance with some embodiments. A substrate 102 is provided, as shown in FIG. 1 in accordance with some embodiments. The substrate 102 may be a bulk semiconductor substrate or a semiconductor-on-insulator (SOI) substrate, which may be doped (e.g., with a p-type or an n-type dopant) or undoped. Generally, an SOI substrate includes a layer of a semiconductor material formed on an insulation layer. The insulation layer may be a buried oxide (BOX) layer or a silicon oxide layer. The insulation layer is provided on a silicon or glass substrate. The substrate 102 may be made of silicon or another semiconductor material. For example, the substrate 102 is a silicon wafer. In some examples, the substrate 102 is made of a compound semiconductor such as silicon carbide, gallium arsenic, indium arsenide, or indium phosphide. In some examples, the substrate 102 is made of an alloy semiconductor such as GaAsP, AlInAs, AlGaAs, GaInAs, GaInP, or GaInAsP.

Multiple fins 106 are formed from the semiconductor material of the substrate 102. FIG. 1 shows only one fin 106, for clarity. The fin 106 protrudes above and between neighboring isolation structures 104, as shown in FIG. 1 in accordance with some embodiments. The isolation structure 104 is for example a shallow trench isolation (STI) structure and is disposed between the fin 106 and an adjacent fin (not shown). The isolation structure 104 is formed on the substrate 102 to electrically isolate the adjacent fins.

A gate structure 114 is formed along sides and over the top surface of the fin 106, and is also formed on the isolation structures 104, as shown in FIG. 1 in accordance with some embodiments. The longitudinal direction of the gate structure 114 is perpendicular to the longitudinal direction of the fin 106. In addition, source and drain regions 112 are formed in the fin 106 at opposite sides of the gate structure 114. The gate structure 114 includes a gate dielectric layer 108 and a gate electrode layer 110 on the gate dielectric layer 108. The gate dielectric layer 108 is conformally formed on the top surface 106T and the sidewall surface 106S of the fin 106.

Generally, the top surface 106T of the fin 106 has a tension greater than the tension at the sidewall surface 106S of the fin 106. In some embodiments, the fin 106 is for example made of silicon, the top surface 106T of the fin 106 has a crystal orientation <100>, and the sidewall surface 106S of the fin 106 has a crystal orientation <110>. Therefore, before performing the implantations of embodiments of the disclosure, the top surface 106T of the fin 106 has more tension and the sidewall surface 106S of the fin 106 has less tension. The tensions at the top surface 106T and the sidewall surface 106S of the fin 106 are non-uniform before performing the implantations of embodiments of the disclosure.

According to embodiments of the disclosure, implantations performed with different dopants on the top surface 106T and the sidewall surface 106S of the fin 106 can regulate the tensions at the top surface and the sidewall surface of the fin to be uniform. The tension at the top surface of the fin is substantially the same as the tension at the sidewall surface of the fin after the implantations are performed. Details of the implantations performed on the top surface 106T and the sidewall surface 106S of the fin 106 will be described below and with reference to the cross-sectional view shown in FIG. 2E.

Moreover, in some embodiments, the gate dielectric layer 108 is referred to as an oxide layer 108. The oxide layer 108 is for example a silicon dioxide ($SiO_2$) layer and may be formed by a thermal oxidation process. Without performing the implantations of embodiments of the disclosure, the thicknesses of an oxide layer formed on the top surface 106T and the sidewall surface 106S of the fin 106 are non-uniform. Generally, the thickness of the oxide layer formed on the top surface 106T is thicker than the thickness of the oxide layer formed on the sidewall surface 106S of the fin 106.

According to embodiments of the disclosure, implantations with different dopants performed on the top surface 106T and the sidewall surface 106S of the fin 106 respectively can regulate the thicknesses of the oxide layer formed on the top surface 106T and the sidewall surface 106S of the fin 106 to be uniform. The thickness of the oxide layer formed on the top surface 106T is substantially the same as the thickness of the oxide layer formed on the sidewall surface 106S of the fin 106. Details of the implantations performed on the top surface 106T and the sidewall surface 106S of the fin 106 will be described below and with reference to the cross-sectional view shown in FIG. 2G.

FIGS. 2A-2J show cross-sectional views of intermediate structures at several stages of fabricating a FinFET device 100 taken along line A-A of FIG. 1, in accordance with some embodiments. The line A-A of FIG. 1 is in a plane along the longitudinal direction of the gate structure 114. In some embodiments, the FinFET device 100 is fabricated using a gate-first process.

Figure 2A:
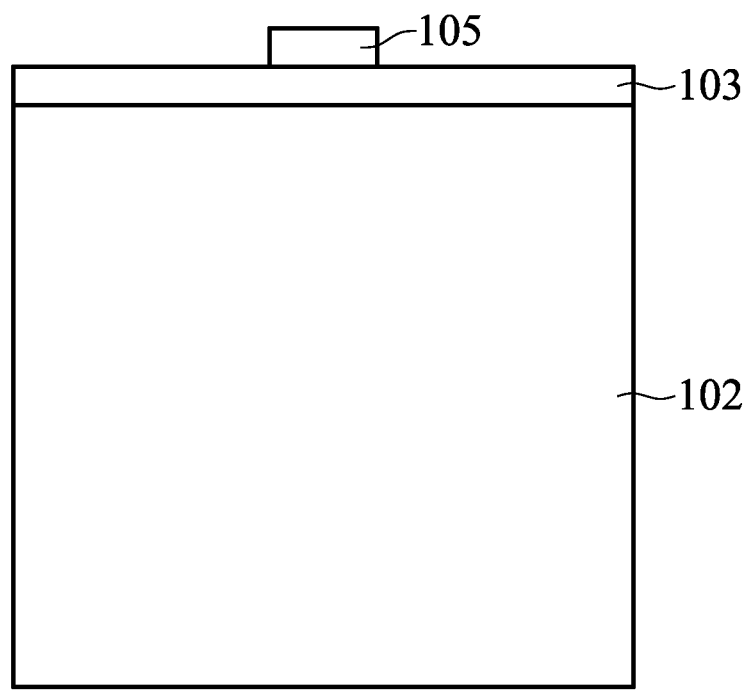
FIGS. 2A-2J show cross-sectional views of intermediate structures at several stages of fabricating a FinFET device taken along line A-A in FIG. 1, in accordance with some embodiments.

A substrate 102 is provided, as shown in FIG. 2A in accordance with some embodiments. The materials of the substrate 102 are the same as or similar to those described with respect to FIG. 1, and are not repeated again. In some embodiments, the substrate 102 is a silicon wafer or is made of a semiconductor material includes silicon.

A mask layer 103 is formed over the substrate 102, as shown in FIG. 2A in accordance with some embodiments. The mask layer 103 will be patterned and used as an etching mask for patterning the substrate 102 to form multiple fins 106. In some examples, the mask layer 103 may be a single-layered or multi-layered structure. The mask layer 103 may be made of silicon oxide, silicon nitride, silicon oxynitride, silicon carbide, silicon carbon nitride, or a combination thereof. The mask layer 103 may be deposited by chemical vapor deposition (CVD), physical vapor deposition (PVD), a high-density plasma chemical vapor deposition (HDPCVD) process, a spin-on process, a sputtering process, or another deposition process.

A patterned photoresist layer 105 is formed over the mask layer 103, as shown in FIG. 2A in accordance with some embodiments. The patterned photoresist layer 105 is used for patterning the mask layer 103. The patterned photoresist layer 105 may be formed in a photolithography process. The photolithography process includes photoresist coating (e.g., spin-on coating), soft baking, photo-mask aligning, exposure, post-exposure baking, developing the photoresist, rinsing and drying (e.g., hard baking).

Figure 2B:
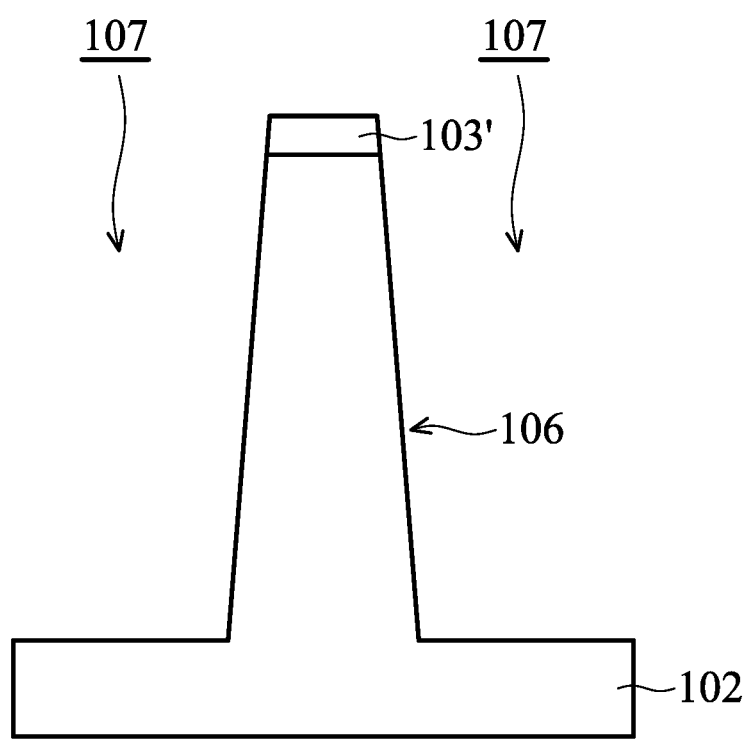

Next, the mask layer 103 is patterned by using the patterned photoresist layer 105 as a mask in an etching process. The etching process may include a reactive ion etch (RIE), neutral beam etch (NBE), inductive coupled plasma (ICP) etch, or a combination thereof. The etching process may be anisotropic. Subsequently, the patterned photoresist layer 105 is removed in an ashing process or a wet strip process. As a result, a patterned mask layer 103' is obtained, as shown in FIG. 2B in accordance with some embodiments. The patterned mask layer 103' may be referred to as a hard mask.

Afterwards, the substrate 102 is etched to form multiple fins 106 by using the patterned mask layer 103' as an etching mask, as shown in FIG. 2B in accordance with some embodiments. The etching process may include a RIE, NBE, ICP etch, or a combination thereof. The etching process may be anisotropic. A trench 107 is formed between neighboring pairs of fins 106. In addition, the fin 106 protrudes from the etched substrate 102. The fins adjacent to the fin 106 are not shown in FIG. 2B.

Figure 2C:
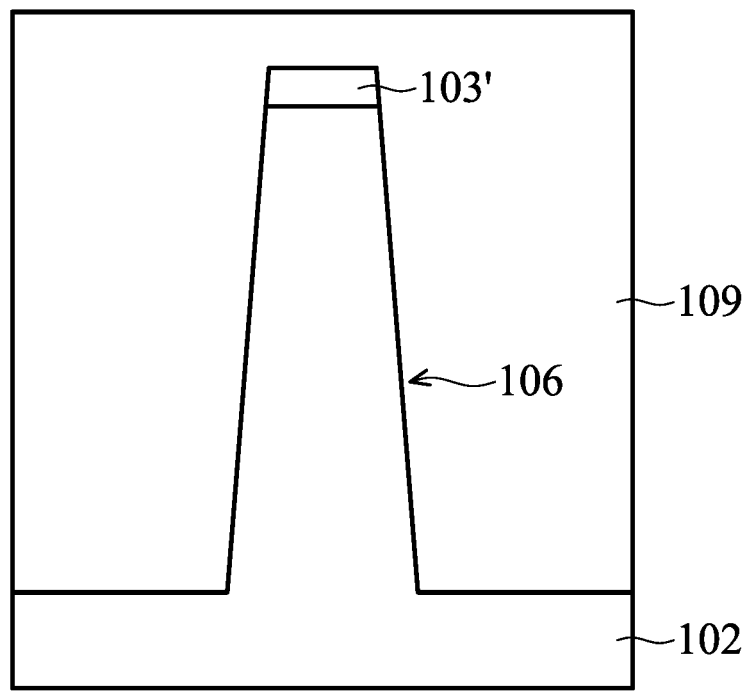

Next, an insulating layer 109 is formed to cover the patterned mask layer 103', the fin 106 and the substrate 102, as shown in FIG. 2C in accordance with some embodiments. Also, the trench 107 (as shown in FIG. 2B) between neighboring pairs of fins 106 is filled with the insulating layer 109. In some examples, the insulating layer 109 is made of silicon oxide, silicon nitride, silicon oxynitride, fluoride-doped silicate glass (FSG), or another low-k dielectric material. The insulating layer 109 may be formed using a deposition process, such as a CVD process, a spin-on-glass (SOG) process, or another applicable process.

Figure 2D:
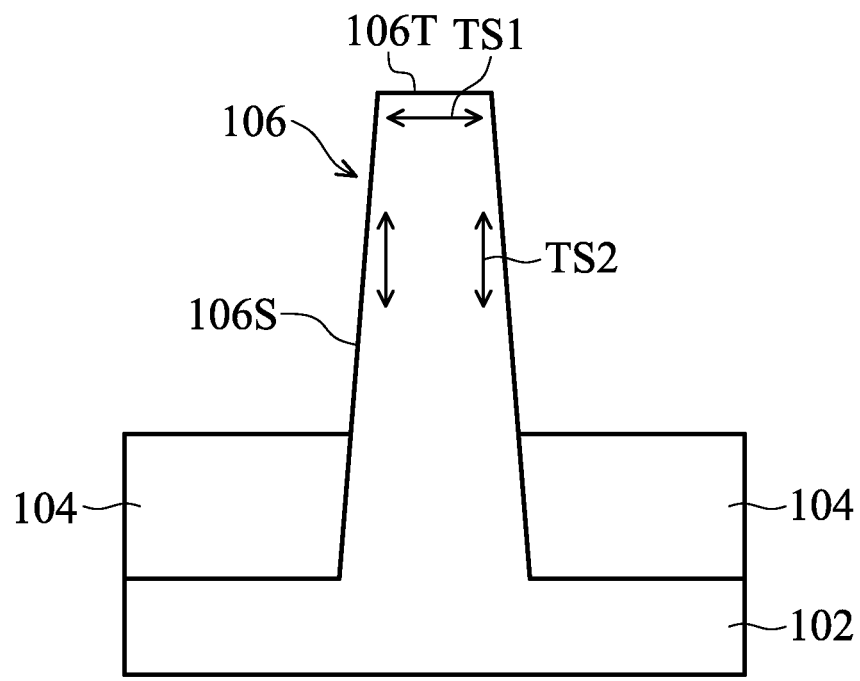

After that, the insulating layer 109 is recessed to form an isolation structure 104, as shown in FIG. 2D in accordance with some embodiments. The isolation structure 104 is for example a shallow trench isolation (STI) structure which surrounds the bottom portion of the fin 106, and is disposed between neighboring pairs of fins 106. The insulating layer 109 is recessed and the patterned mask layer 103' is removed in a planarization process and an etching process. The planarization process is for example a chemical mechanical polishing (CMP) process, which expose the top surface of the patterned mask layer 103'. The patterned mask layer 103' is then removed in a wet etching process that uses for example a phosphoric acid ($H_3PO_4$) etching solution. Next, a portion of the insulating layer 109 is removed in a dry etching process that uses etching gases. In some examples, the etching gases include hydrogen fluoride (HF) gas, ammonia ($NH_3$) gas, and dilute gas (such as $N_2$ or Ar). As a result, the fin 106 protrudes above and between the isolation structures 104, as shown in FIG. 2D in accordance with some embodiments. The fin 106 has a top surface 106T and a sidewall surface 106S which are exposed from the isolation structures 104. As per the description above, the top surface 106T has a tension TS1 that is greater than the tension TS2 at the sidewall surface 106S of the fin 106.

Figure 2E:
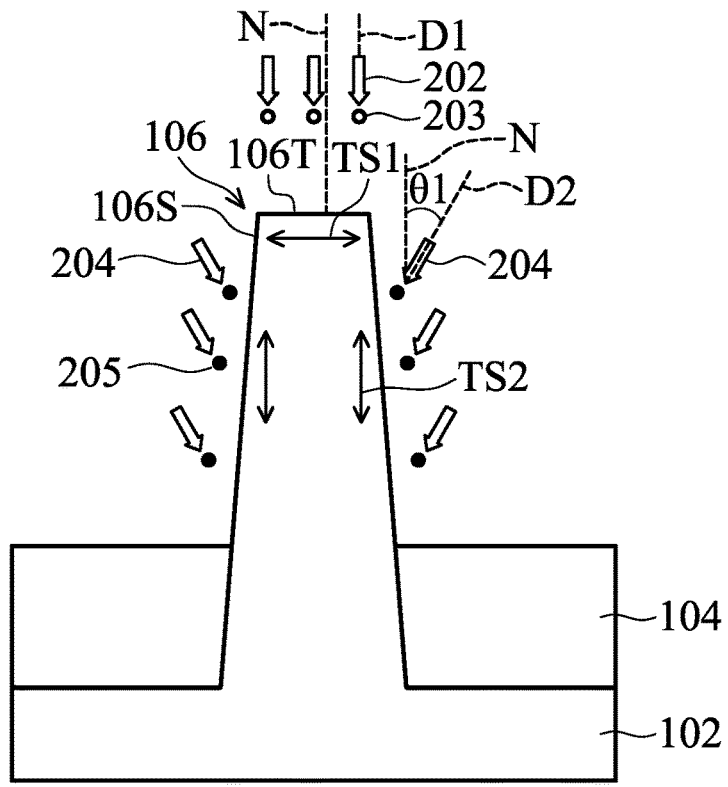
Figure 2F:
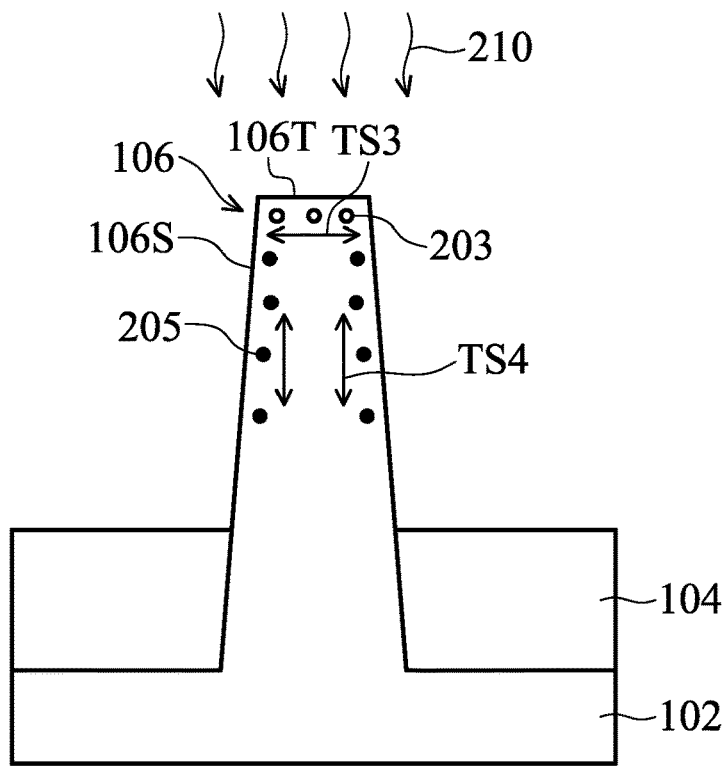

According to some embodiments of the disclosure, an implantation 202 is performed on the top surface 106T of the fin 106, as shown in FIG. 2E. In some embodiments, the fin 106 is made of silicon or includes silicon. The implantation 202 is performed with a first dopant 203 which has a smaller atomic radius than silicon. In some embodiments, the first dopant 203 is, for example, carbon (C), nitrogen (N), boron (B), or a combination thereof. After the first dopant 203 is implanted on the top surface 106T of the fin 106, the tension TS1 at the top surface 106T is reduced into a tension TS3, as shown in FIG. 2F in accordance with some embodiments. The tension TS3 is less than the tension TS1. The first dopant 203 has a smaller atomic radius than the material of the fin 106 and can compress the original tension TS1 at the top surface 106T of the fin 106 through the implantation 202 performed on the top surface 106T.

Moreover, in some embodiments, the implantation 202 with the first dopant 203 is performed on the top surface 106T at a tilt angle of about 0 degree. The tilt angle is defined as the angle between the implantation direction D1 of the implantation 202 and the normal direction N of the substrate 102. In addition, in some embodiments, the doping dosage of the first dopant 203 in the implantation 202 is in a range from about 1e13 atoms/$cm^2$ to about 2e16 atoms/$cm^2$. The doping energy of the first dopant 203 in the implantation 202 is in a range from about 0.5 keV to about 400 keV. The doping depth of the first dopant 203 from the top surface 106T of the fin 106 is in a range from about 5 Å to about 200 Å. The doping concentration of the first dopant 203 at the top surface 106T of the fin 106 is in a range from about 1e18 atoms/$cm^3$ to about 2e21 atoms/$cm^3$.

Moreover, according to some embodiments of the disclosure, another implantation 204 is performed on the sidewall surface 106S of the fin 106 as shown in FIG. 2E. In some embodiments, the fin 106 is made of silicon or includes silicon. The implantation 204 is performed with a second dopant 205 which has a larger atomic radius than silicon. In some embodiments, the second dopant 205 is for example germanium (Ge), tin (Sn), indium (In), gallium (Ga), arsenic (As) or a combination thereof. After the second dopant 205 is implanted on the sidewall surface 106S of the fin 106, the tension TS2 at the sidewall surface 106S is increased into a tension TS4, as shown in FIG. 2F in accordance with some embodiments. The tension TS4 is greater than the tension TS2. The second dopant 205 has a larger atomic radius than the material of the fin 106 and can stretch the original tension TS2 at the sidewall surface 106S of the fin 106 through the implantation 204 performed on the sidewall surface 106S.

In addition, in some embodiments, the implantation 204 with the second dopant 205 is performed on the sidewall surface 106S at a tilt angle θ1 of about 15 degrees to about 40 degrees. The tilt angle θ1 is defined as the angle between the implantation direction D2 of the implantation 204 and the normal direction N of the substrate 102. Furthermore, in some embodiments, the doping dosage of the second dopant 205 in the implantation 204 is in a range from about 1e13 atoms/$cm^2$ to about 2e16 atoms/$cm^2$. The doping energy of the second dopant 205 in the implantation 204 is in a range from about 0.5 keV to about 400 keV. The doping depth of the second dopant 205 from the sidewall surface 106S of the fin 106 is in a range from about 5 Å to about 200 Å. The doping concentration of the second dopant 205 at the sidewall surface 106S of the fin 106 is in a range from about 1e18 atoms/$cm^3$ to about 2e21 atoms/$cm^3$.

According to the embodiments of the disclosure, after the implantation 202 and the implantation 204 are performed on the fin 106, the tension TS3 at the top surface 106T and the tension TS4 at the sidewall surface 106S of the fin 106 are substantially uniform. In some embodiments, the implantation 202 may be performed before the implantation 204. In some other embodiments, the implantation 204 may be performed before the implantation 202.

In some embodiments, after the implantation 202 and the implantation 204 are performed on the fin 106, a thermal treatment 210 is applied to the fin 106 as shown in FIG. 2F in accordance with some embodiments. The thermal treatment 210 can activate the first dopant 203 at the top surface 106T of the fin 106. At the same time, the thermal treatment 210 can activate the second dopant 205 at the sidewall surface 106S of the fin 106. In some embodiments, the thermal treatment 210 may be performed at a temperature in a range from about 500° C. to about 1000° C. In addition, the duration of the thermal treatment 210 may be performed in a range from about 10 seconds to about 600 seconds. In some other embodiments, the thermal treatment 210 of FIG. 2F may be omitted.

Figure 2G:
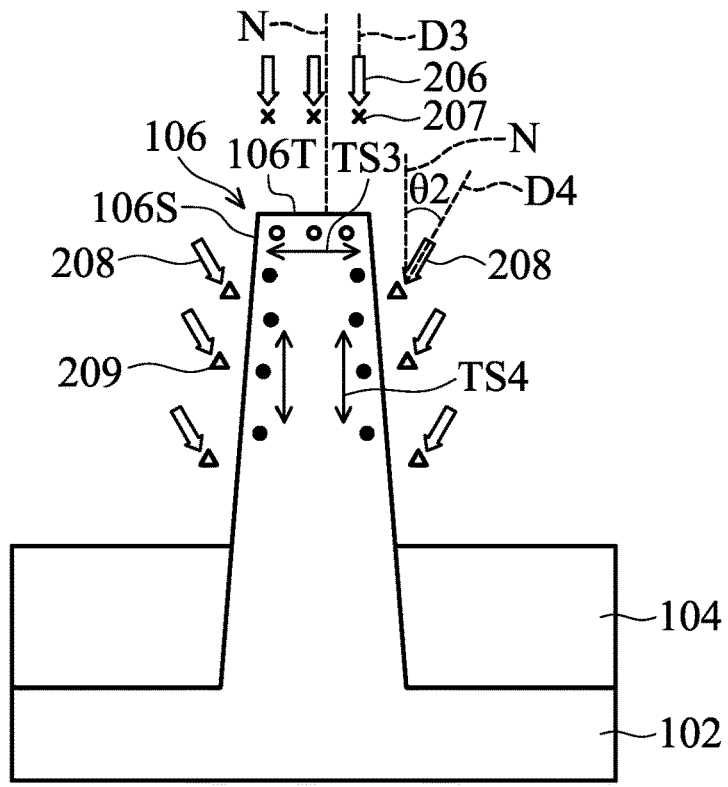

According to some embodiments of the disclosure, an implantation 206 is performed on the top surface 106T of the fin 106, as shown in FIG. 2G. In some embodiments, an oxide layer 108, for example a gate dielectric layer, as shown in FIG. 2I, is subsequently formed on the top surface 106T and the sidewall surface 106S of the fin 106. The implantation 206 is performed with a third dopant 207 which has the ability to inhibit oxidation of the fin 106 or the ability to inhibit oxide formation on the fin 106. The third dopant 207 is also referred to as an oxidation inhibitor dopant. In some embodiments, the third dopant 207 is for example nitrogen (N), carbon (C) or a combination thereof. After the third dopant 207 is implanted on the top surface 106T of the fin 106, the formation rate of the oxide layer 108 on the top surface 106T is retarded while compared to without the third dopant 207. The third dopant 207, having the ability to inhibit oxidation of the fin 106 or the ability to inhibit oxide formation on the fin 106, can reduce the thickness of the oxide layer 108 formed on the top surface 106T of the fin 106 through the implantation 206 performed on the top surface 106T before forming the oxide layer 108.

Moreover, in some embodiments, the implantation 206 with the third dopant 207 is performed on the top surface 106T at a tilt angle of about 0 degree. The tilt angle is defined as the angle between the implantation direction D3 of the implantation 206 and the normal direction N of the substrate 102. In addition, in some embodiments, the doping dosage of the third dopant 207 in the implantation 206 is in a range from about 1e13 atoms/cm$^2$ to about 2e16 atoms/cm$^2$. The doping energy of the third dopant 207 in the implantation 206 is in a range from about 0.5 keV to about 400 keV. The doping depth of the third dopant 207 from the top surface 106T of the fin 106 is in a range from about 5 Å to about 200 Å. The doping concentration of the third dopant 207 at the top surface 106T of the fin 106 is in a range from about 1e18 atoms/cm$^3$ to about 2e21 atoms/cm$^3$.

In addition, according to some embodiments of the disclosure, another implantation 208 is performed on the sidewall surface 106S of the fin 106 as shown in FIG. 2G. In some embodiments, the oxide layer 108, for example the gate dielectric layer, as shown in FIG. 2I, is subsequently formed on the top surface 106T and the sidewall surface 106S of the fin 106. The implantation 208 is performed with a fourth dopant 209 which has the ability to accelerate oxidation of the fin 106 or the ability to accelerate oxide formation on the fin 106. The fourth dopant 209 is also referred to as an oxidation accelerator dopant. In some embodiments, the fourth dopant 209 is for example oxygen (O). After the fourth dopant 209 is implanted on the sidewall surface 106S of the fin 106, the formation rate of the oxide layer 108 on the sidewall surface 106S is accelerated while compared to without the fourth dopant 209. The fourth dopant 209, having the ability to accelerate oxidation of the fin 106 or the ability to accelerate oxide formation on the fin 106, can increase the thickness of the oxide layer 108 formed on the sidewall surface 106S of the fin 106 through the implantation 208 performed on the sidewall surface 106S.

Moreover, in some embodiments, the implantation 208 with the fourth dopant 209 is performed on the sidewall surface 106S at a tilt angle θ2 of about 15 degrees to about 40 degrees. The tilt angle θ2 is defined as the angle between the implantation direction D4 of the implantation 208 and the normal direction N of the substrate 102. In addition, in some embodiments, the doping dosage of the fourth dopant 209 in the implantation 208 is in a range from about 1e13 atoms/cm$^2$ to about 2e16 atoms/cm$^2$. The doping energy of the fourth dopant 209 in the implantation 208 is in a range from about 0.5 keV to about 400 keV. The doping depth of the fourth dopant 209 from the sidewall surface 106S of the fin 106 is in a range from about 5 Å to about 200 Å. The doping concentration of the fourth dopant 209 at the sidewall surface 106S of the fin 106 is in a range from about 1e18 atoms/cm$^3$ to about 2e21 atoms/cm$^3$.

According to the embodiments of the disclosure, after the implantation 206 and the implantation 208 are performed on the fin 106, the third dopant 207 at the top surface 106T and the fourth dopant 209 at the sidewall surface 106S of the fin 106 can regulate the thickness of the oxide layer 108 formed on the top surface 106T and the thickness of the oxide layer 108 formed on the sidewall surface 106S to be substantially uniform. Moreover, in some embodiments, the implantation 206 may be performed before the implantation 208. In some other embodiments, the implantation 208 may be performed before the implantation 206.

Figure 2H:
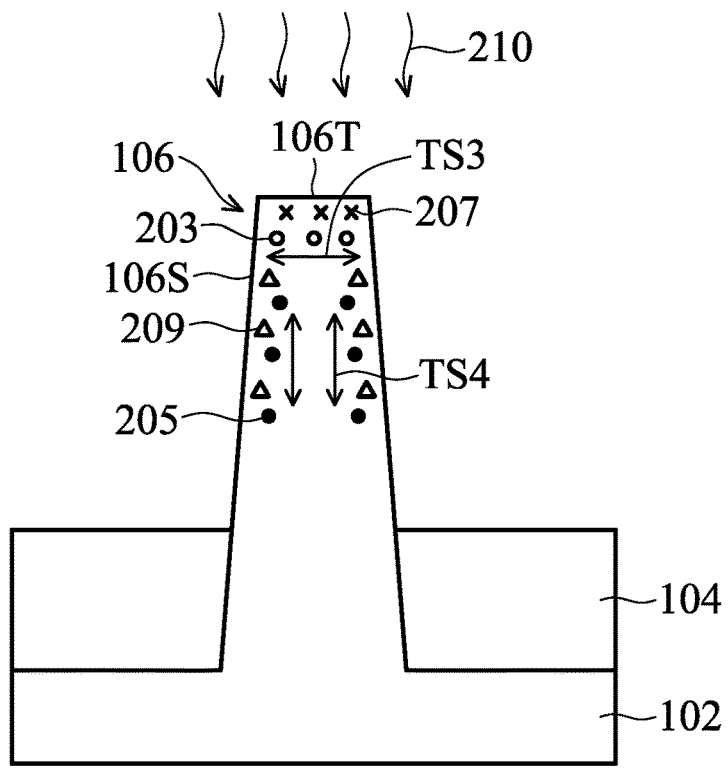
Figure 2I:
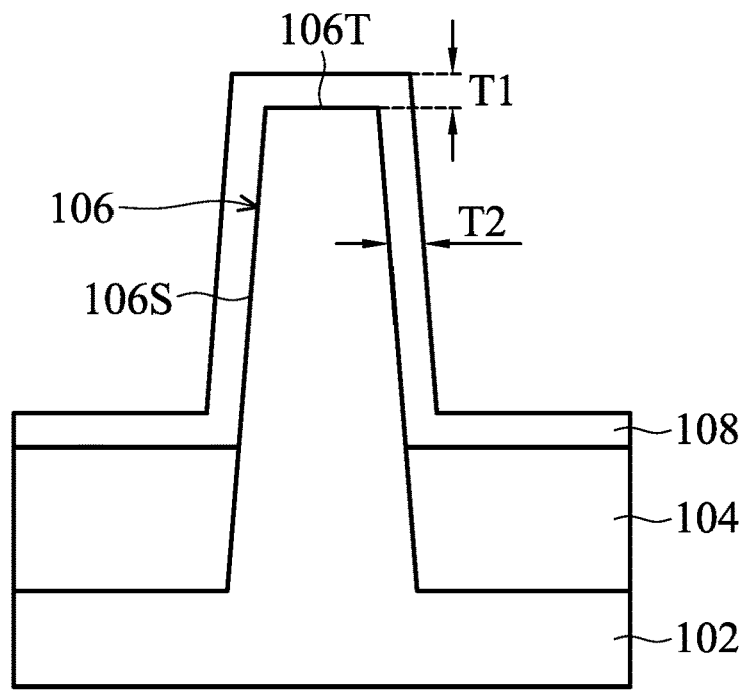

After the implantations 206 and 208 of FIG. 2G are performed, a thermal treatment 210 is performed on the fin 106, as shown in FIG. 2H in accordance with some embodiments. The thermal treatment 210 can activate the third dopant 207 at the top surface 106T of the fin 106. At the same time, the thermal treatment 210 can activate the fourth dopant 209 at the sidewall surface 106S of the fin 106. In some embodiments, the thermal treatment 210 may be performed at a temperature in a range from about 500° C. to about 1000° C. In addition, the duration of the thermal treatment 210 may be performed in a range from about 10 seconds to about 600 seconds. In some embodiments, the thermal treatment 210 of FIG. 2H can also active the first dopant 203 at the top surface 106T and the second dopant 205 at the sidewall surface 106S of the fin 106. Therefore, the thermal treatment 210 of FIG. 2F may be omitted.

In some embodiments, the oxide layer 108 is formed on the top surface 106T and the sidewall surface 106S of the fin 106 using a thermal oxidation process. The thermal treatment 210 can also be used to form the oxide layer 108 on the top surface 106T and the sidewall surface 106S of the fin 106. In some other embodiments, the oxide layer 108 is formed on the top surface 106T and the sidewall surface 106S of the fin 106 using a chemical oxidation process or a deposition process. After the thermal treatment 210 is performed to activate the dopants at the top surface 106T and the sidewall surface 106S of the fin 106, the oxide layer 108 is conformally formed on the fin 106 by a chemical oxidation process or a deposition process.

Following FIG. 2H, the oxide layer 108 is formed on the top surface 106T and the sidewall surface 106S of the fin 106, as shown in FIG. 2I in accordance with some embodiments. In some embodiments, the oxide layer 108 may be a gate dielectric layer. According to embodiments of the disclosure, after the implantations 206 and 208 are respectively performed on the top surface 106T and the sidewall surface 106S of the fin 106, the thickness T1 of the oxide layer 108 on the top surface 106T and the thickness T2 of the oxide layer 108 on the sidewall surface 106S are substantially the same. Therefore, the oxide layer 108 has uniform thickness at the top surface 106T and the sidewall surface 106S of the fin 106.

In some embodiments, the oxide layer 108 is for example a silicon dioxide ($SiO_2$) layer and is formed by a thermal oxidation process. In some other embodiments, the oxide layer 108 includes silicon oxide, a high-k dielectric material, multilayers thereof, or other dielectric materials. The high-k dielectric material may have a k value greater than about 7.0, and may include a metal oxide or a metal silicate of hafnium (Hf), aluminum (Al), zirconium (Zr), lanthanum (La), magnesium (Mg), barium (Ba), titanium (Ti), lead (Pb), multilayers thereof, or a combination thereof. The oxide layer 108 may be deposited by atomic layer deposition (ALD), plasma enhanced CVD (PECVD), Molecular-Beam Deposition (MBD), or another deposition technique. In some examples, the oxide layer 108 is used as a gate dielectric layer and has a thickness in a range from about 30 Å to about 50 Å.

Figure 2J:
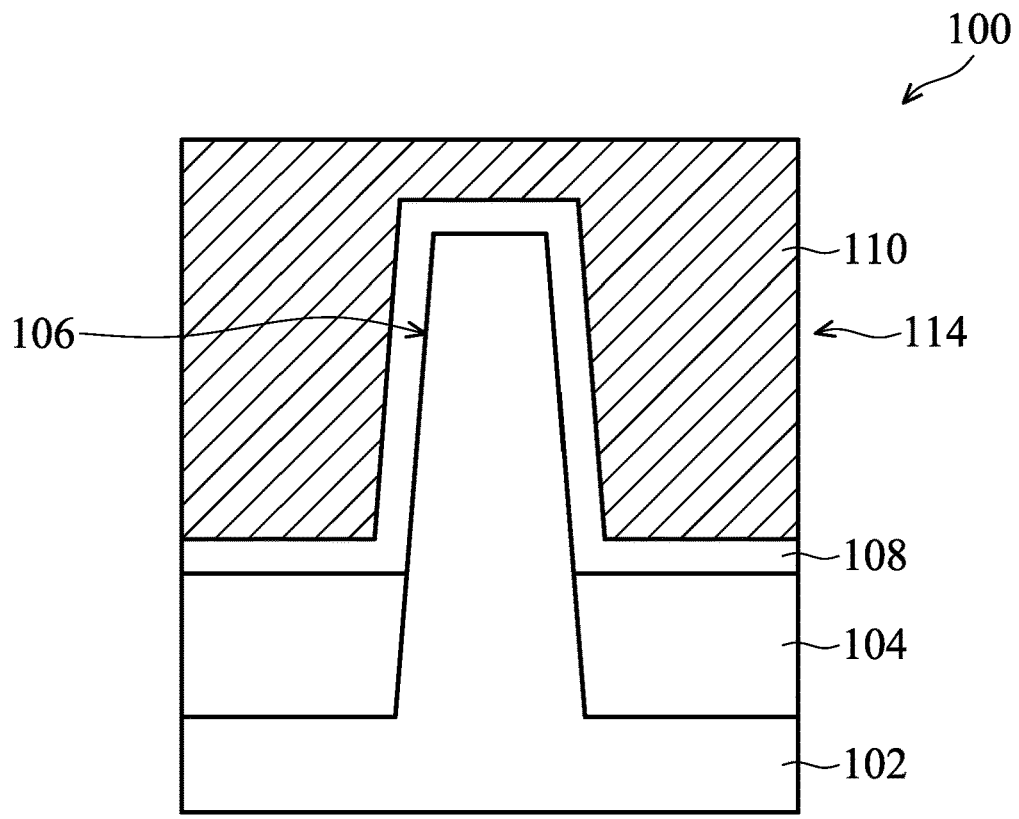

After that, a gate electrode layer 110 is deposited on the oxide layer 108 to form a gate structure 114, as shown in FIG. 2J in accordance with some embodiments. In some embodiments, the gate electrode layer 110 is made of a metal such as tungsten, cobalt, aluminum, ruthenium, copper, or a combination thereof. The gate electrode layer 110 may be deposited by ALD, PECVD, MBD, PVD, or another deposition process. Although not shown in FIG. 2J, other functional layers, such as a capping layer, a barrier layer, a work-function tuning layer or a combination thereof may be formed between the oxide layer 108 and the gate electrode layer 110. A portion of the fin 106 directly under the gate structure 114 is used as a channel region. In addition, source and drain regions 112 (as shown in FIG. 1) are formed in the fin 106 and at the opposite sides of the gate structure 114. In some embodiments, the source and drain regions 112 may be formed by implanting a suitable dopant for p-type or n-type FinFET device into the fin 106 using the gate structure 114 and gate spacers (not shown) on the sidewalls of the gate structure 114 as a mask. Afterwards, the FinFET device 100 is fabricated.

FIGS. 3A-3I show cross-sectional views of intermediate structures at several stages of fabricating a FinFET device 200 taken along line B-B in FIG. 1, in accordance with some embodiments. The line B-B of FIG. 1 is in a plane along the channel region in the fin 106 between opposing source and drain regions 112. In some embodiments, the FinFET device 200 is fabricated using a gate-last process and following the structure of FIG. 1. In the embodiment, the gate structure 114 of FIG. 1 is a dummy gate structure and will be replaced with a real or replacement gate structure in the gate-last process.

Figure 3A:
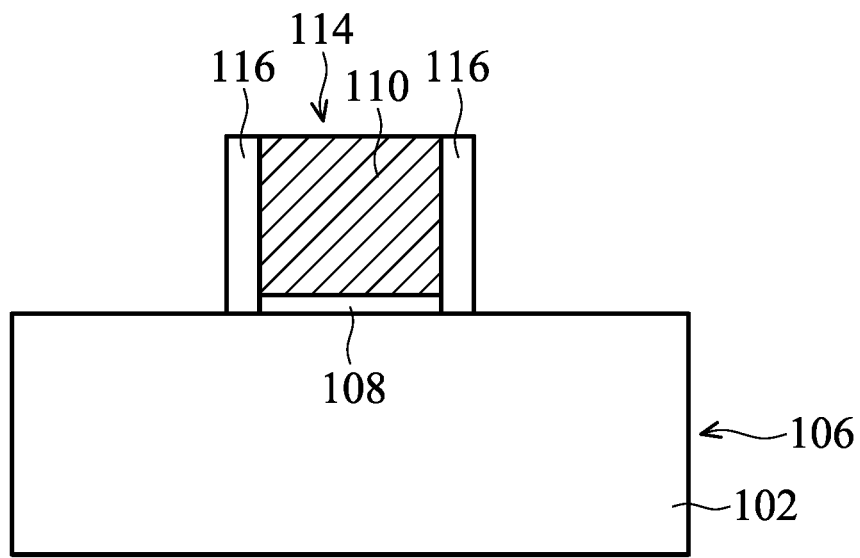
FIGS. 3A-3I show cross-sectional views of intermediate structures at several stages of fabricating a FinFET device taken along line B-B in FIG. 1, in accordance with some other embodiments.

A substrate 102 is provided and a fin 106 protrudes from the substrate 102, as shown in FIG. 1 and FIG. 3A in accordance with some embodiments. The materials of the substrate 102 and the fin 106 and the processes of forming the fin 106 are the same as or similar to those described with respect to FIG. 1 and FIGS. 2A to 2B, and are not repeated again. In the embodiment, the dummy gate structure 114 is formed over the fin 106, as shown in FIG. 3A in accordance with some embodiments. Moreover, the dummy gate structure 114 is formed along the sidewalls of the fin 106 (as shown in FIG. 1).

The dummy gate structure 114 includes the oxide layer 108. In some embodiments, the oxide layer 108 may remain in the gate-last process to be used as an interfacial layer of a real gate structure. In the embodiments, the oxide layer 108 used as the interfacial layer may be a silicon dioxide ($SiO_2$) layer and may be formed by a thermal oxidation process. According to some embodiments of the disclosure, before forming the oxide layer 108, the top surface and the sidewall surface of the fin 106 are implanted with the first dopant 203 and the second dopant 205 through the implantations 202 and 204, respectively, with respect to FIG. 2E to regulate the tensions at the top surface and the sidewall surface of the fin 106 to be uniform. In addition, the thermal treatment 210 of FIG. 2F may be performed on the fin 106 after the implantations 202 and 204. In some embodiments, the oxide layer 108 used as an interfacial layer of a real gate structure may be formed by a thermal oxidation process using the thermal treatment 210 of FIG. 2F and has a thickness in a range from about 10 Å to about 50 Å.

According to some embodiments of the disclosure, before forming the oxide layer 108, and after the above-mentioned implantations 202 and 204, the implantations 206 and 208 with respect to FIG. 2G are performed on the top surface and the sidewall surface of the fin 106, respectively. The third dopant 207 and the fourth dopant 209 as described with respect to FIG. 2G can regulate the thickness of the oxide layer 108 to be uniform between the top surface and the sidewall surface of the fin 106. In some embodiments, after the implantations 206 and 208, the thermal treatment 210 of FIG. 2H is performed on the fin 106, and the thermal treatment 210 of FIG. 2F can be omitted. Similarly, the thermal treatment 210 of FIG. 2H can be used to form the oxide layer 108 without additional deposition process.

In some other embodiments, the oxide layer 108 is formed by a chemical oxidation or a deposition process after the thermal treatment 210 of FIG. 2H. The oxide layer 108 may include dielectric materials, such as silicon oxide, silicon oxynitride, or a combination thereof. The oxide layer 108 is formed by chemical vapor deposition (CVD), physical vapor deposition (PVD), atomic layer deposition (ALD), high density plasma CVD (HDPCVD), metal organic CVD (MOCVD), or plasma enhanced CVD (PECVD). In some embodiments, the oxide layer 108 is used as a dummy gate dielectric layer and is removed in the gate-last process.

In some embodiments, the implantations 206 and 208 of FIG. 2G may be performed after the implantations 202 and 204 of FIG. 2E. In some embodiments, the implantations 206 and 208 of FIG. 2G may be performed before the implantations 202 and 204 of FIG. 2E. In some embodiments, the implantations 206 and 208 of FIG. 2G may be performed independently without performing the implantations 202 and 204 of FIG. 2E. In some embodiments, the implantations 202 and 204 of FIG. 2E may be performed independently without performing the implantations 206 and 208 of FIG. 2G.

The dummy gate structure 114 also includes a dummy gate electrode layer 110 on the oxide layer 108, as shown in FIG. 3A in accordance with some embodiments. The dummy gate electrode layer 110 may be made of polysilicon. The dummy gate electrode layer 110 may be formed using a deposition process, such as CVD, PVD, ALD, HDPCVD, MOCVD, or PECVD.

Next, gate spacers 116 are formed along sidewalls of the dummy gate structure 114, as shown in FIG. 3A in accordance with some embodiments. In some examples, the gate spacers 116 are made of silicon oxide, silicon nitride, silicon oxynitride, another dielectric material, or a combination thereof. The gate spacers 116 may be formed by CVD, ALD or another deposition process.

Figure 3B:
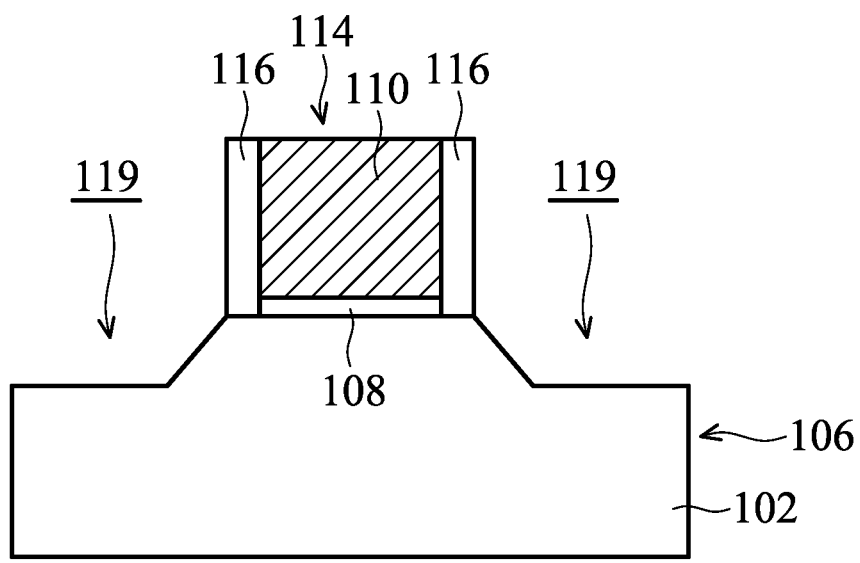

After that, recesses 119 for source and drain regions are formed in the fin 106, as shown in FIG. 3B in accordance with some embodiments. The recesses 119 may be formed using a dry etch process, such as RIE, NBE or another suitable process, or using a wet etch process, such as using tetramethylammonium hydroxide (TMAH), ammonium hydroxide (NH$_4$OH), or another etchant.

Figure 3C:
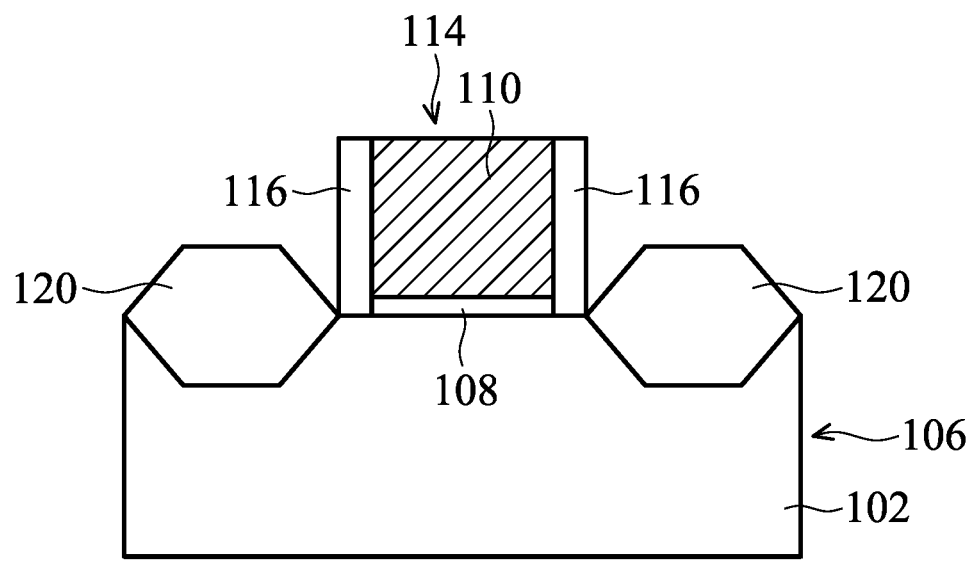

Next, epitaxial source and drain regions 120 are formed in the recesses 119, as shown in FIG. 3C in accordance with some embodiments. The epitaxial source and drain regions 120 may be made of silicon germanium (Si$_x$Ge$_{1-x}$, where x can be between approximately 0 and 1), silicon carbide, silicon phosphorus, silicon carbon phosphorus, pure germanium, a III-V compound semiconductor, or a II-VI compound semiconductor. The material of III-V compound semiconductor is for example InAs, AlAs, GaAs, InP, GaN, InGaAs, InAlAs, GaSb, AlSb, AlP, or GaP. The epitaxial source and drain regions 120 may be formed in the recesses 119 by an epitaxial growth process, such as metal-organic CVD (MOCVD), molecular beam epitaxy (MBE), liquid phase epitaxy (LPE), vapor phase epitaxy (VPE), selective epitaxial growth (SEG), or a combination thereof.

Figure 3D:
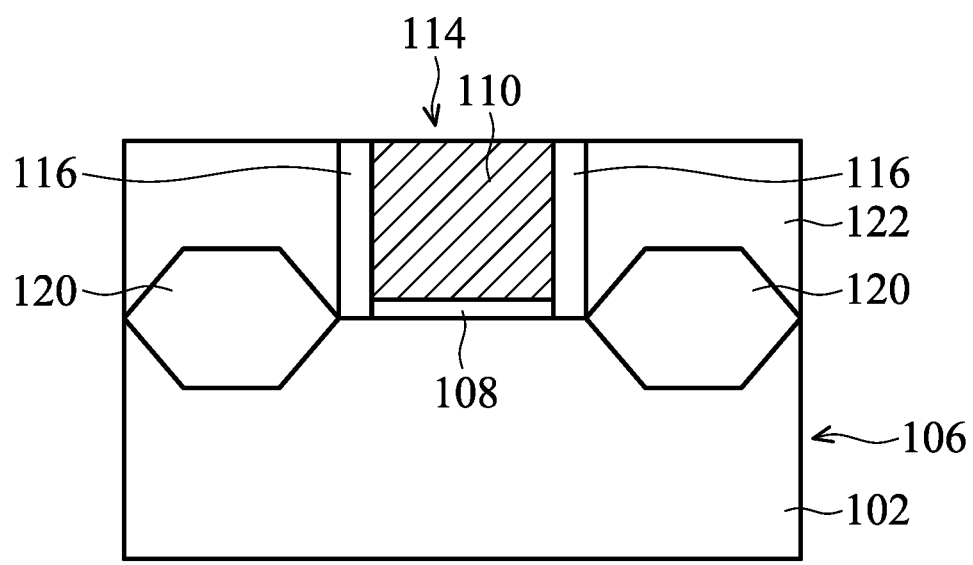

After that, an interlayer dielectric (ILD) layer 122 is formed over the epitaxial source and drain regions 120, the gate spacers 116 and the dummy gate structure 114, and is also formed on the isolation structure 104 (FIG. 1) in accordance with some embodiments. The ILD layer 122 may be made of silicon dioxide, silicon oxynitride, phosphosilicate glass (PSG), borosilicate glass (BSG), borophosphosilicate glass (BPSG), undoped silicate glass (USG), fluorinated silicate glass (FSG), Spin-On-Glass (SOG), or a combination thereof. The ILD layer 122 may be deposited by spin-on coating, CVD, flowable CVD (FCVD), PECVD, PVD, or another deposition process. Then, a planarization process, such as a CMP process, is performed on the ILD layer 122 until the top surface of the dummy gate structure 114 is exposed, as shown in FIG. 3D in accordance with some embodiments. Moreover, the top surfaces of the dummy gate structure 114, the gate spacers 116 and the ILD layer 122 are coplanar after the CMP process.

Figure 3E:
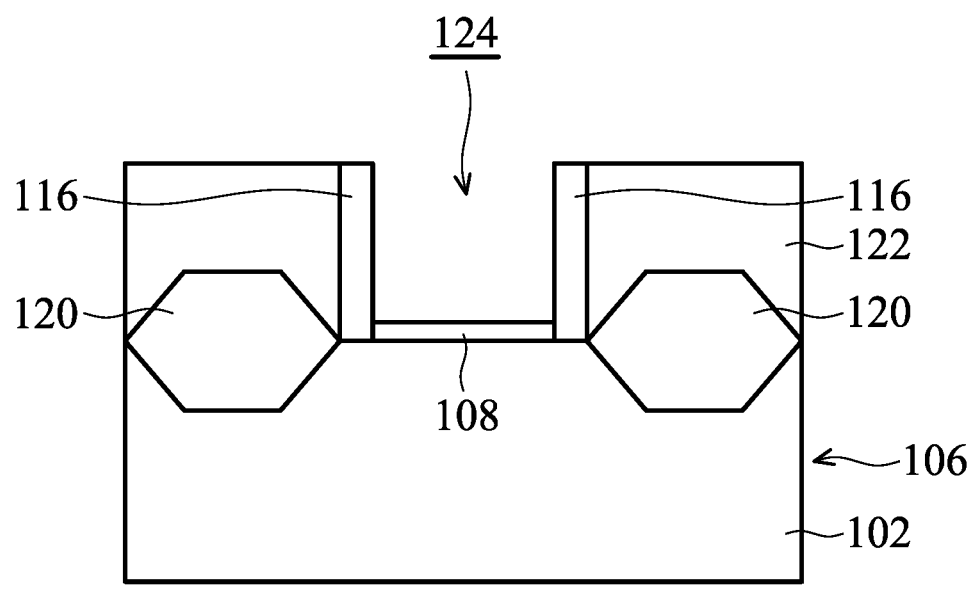

Afterwards, the dummy gate electrode layer 110 is removed and the oxide layer 108 may remain to form a recess 124 between the gate spacers 116, as shown in FIG. 3E in accordance with some embodiments. The dummy gate electrode layer 110 may be removed by an etching process, such as RIE, NBE or another suitable process. The oxide layer 108 may be used as an interfacial layer of a real gate structure. According to embodiments of the disclosure, the thickness of the oxide layer 108 at the top surface of the fin is substantially the same as that at the sidewall surface of the fin 106.

Figure 3F:
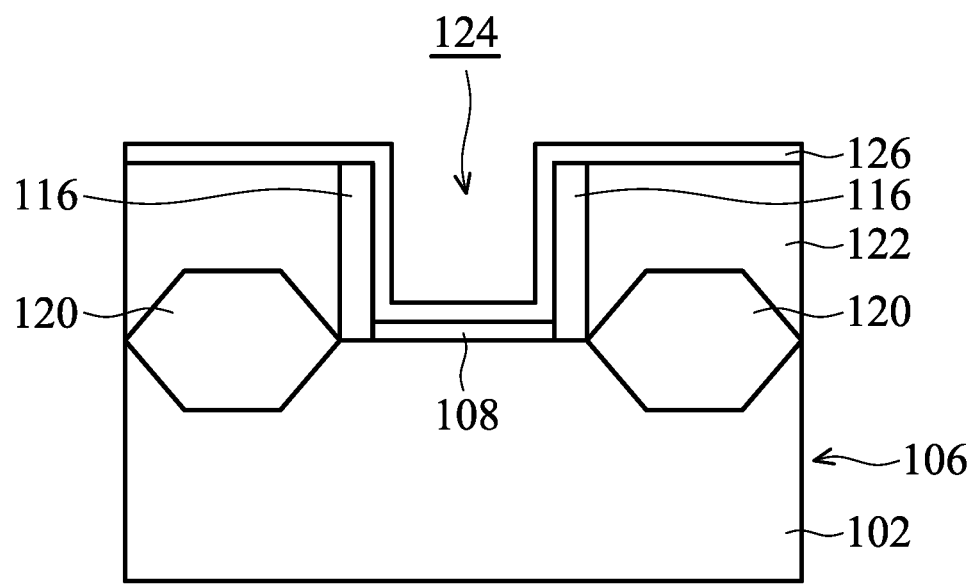

Next, a gate dielectric layer 126 is conformally deposited in the recess 124 and on the top surfaces of the gate spacers 116 and the ILD layer 122, as shown in FIG. 3F in accordance with some embodiments. In some embodiments, the gate dielectric layer 126 is deposited on the oxide layer 108. In some other embodiments, the oxide layer 108 may be removed, and the gate dielectric layer 126 is deposited directly on the top surface and the sidewall surface of the fin 106. According to some embodiments of the disclosure, the top surface of the fin 106 is implanted with the first dopant 203, the third dopant 207, or a combination thereof. Also, the sidewall surface of the fin 106 is implanted with the second dopant 205, the fourth dopant 209, or a combination thereof. The implantations of the first dopant 203 and the second dopant 205 can regulate the tensions at the top surface and the sidewall surface of the fin 106 to be uniform. The implantations of the third dopant 207 and the fourth dopant 209 can regulate the thicknesses of the oxide layer 108 or the gate dielectric layer 126 of an oxide layer directly formed on the top surface and the sidewall surface of the fin 106 to be uniform.

In some embodiments, the gate dielectric layer 126 is made of silicon oxide, silicon nitride, a high-k dielectric material, multilayers thereof, or other dielectric material. The high-k dielectric material may have a dielectric constant (k value) greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof. The gate dielectric layer 126 may be deposited by ALD, PECVD, MBD, or another deposition process.

Figure 3G:
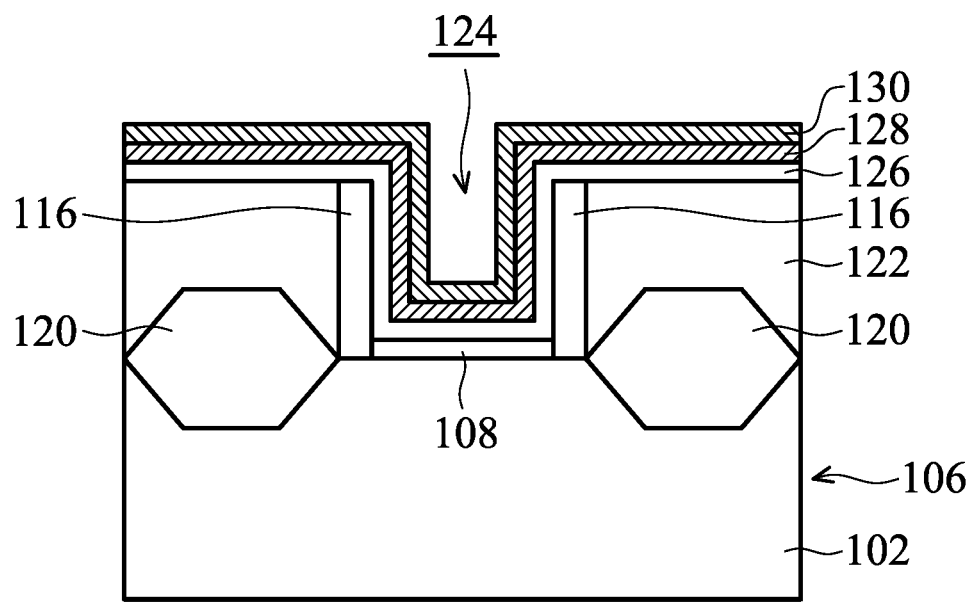

Next, a barrier layer 128 and a work-function tuning layer 130 are conformally deposited in sequence in the recess 124 and on the gate dielectric layer 126, as shown in FIG. 3G in accordance with some embodiments. The barrier layer 128 may be, for example, tantalum nitride, tantalum-silicon nitride, tantalum-carbon nitride, tantalum-aluminum nitride, titanium nitride, titanium-silicon nitride, titanium-carbon nitride, titanium-aluminum nitride, aluminum nitride, or a combination thereof. The work-function tuning layer 130 may be a p-type or an n-type work-function tuning layer which is dependent on the type of the FinFET device. The work-function tuning layer 130 may be, for example, TaN, NiSi, CoSi, TiN, WN, TiAl, TiAlN, TaCN, TaC, TaSiN, TaAl, TaAlC, TaN, ZrSi$_2$, MoSi$_2$, TaSi$_2$, NiSi$_2$, or a combination thereof. The barrier layer 128 and the work-function tuning layer 130 may be independently deposited by ALD, PECVD, MBD, or another deposition technique.

Figure 3H:
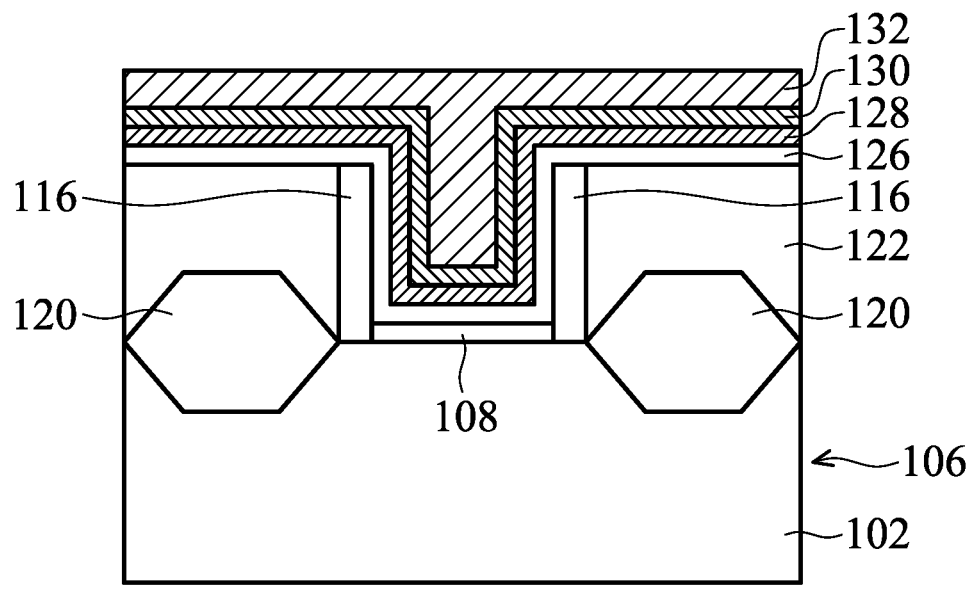

Next, a gate electrode layer 132 is deposited on the work-function tuning layer 130 and fills the remaining portion of the recess 124, as shown in FIG. 3H in accordance with some embodiments. The gate electrode layer 132 may include aluminum (Al), copper (Cu), titanium (Ti), tantalum (Ta), tungsten (W), cobalt (Co), other suitable materials, or a combination thereof. The gate electrode layer 132 may be deposited by ALD, PECVD, MBD, PVD, or another deposition process.

Figure 3I:
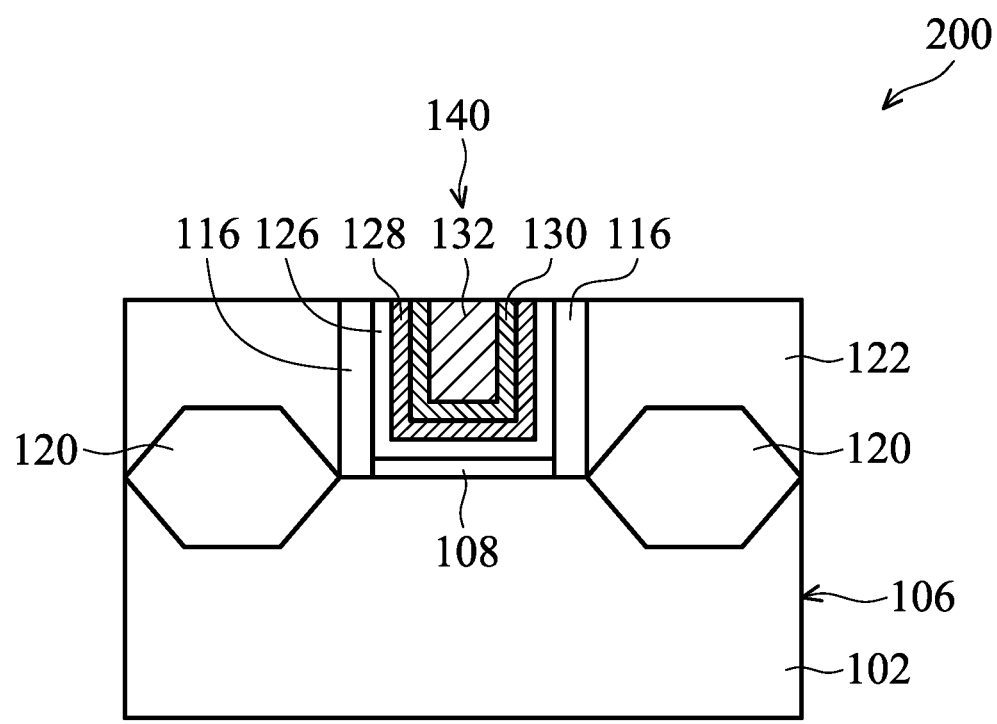

Afterwards, a planarization process is performed on the structure of FIG. 3H to remove the excess portions of the gate dielectric layer 126, the barrier layer 128, the work-function tuning layer 130 and the gate electrode layer 132 to form a real or replacement gate structure 140, as shown in FIG. 3I in accordance with some embodiments. After the planarization process, the top surfaces of the gate structure 140, the gate spacers 116 and the ILD layer 122 are coplanar. Afterwards, the FinFET device 200 is fabricated.

Figure 4:
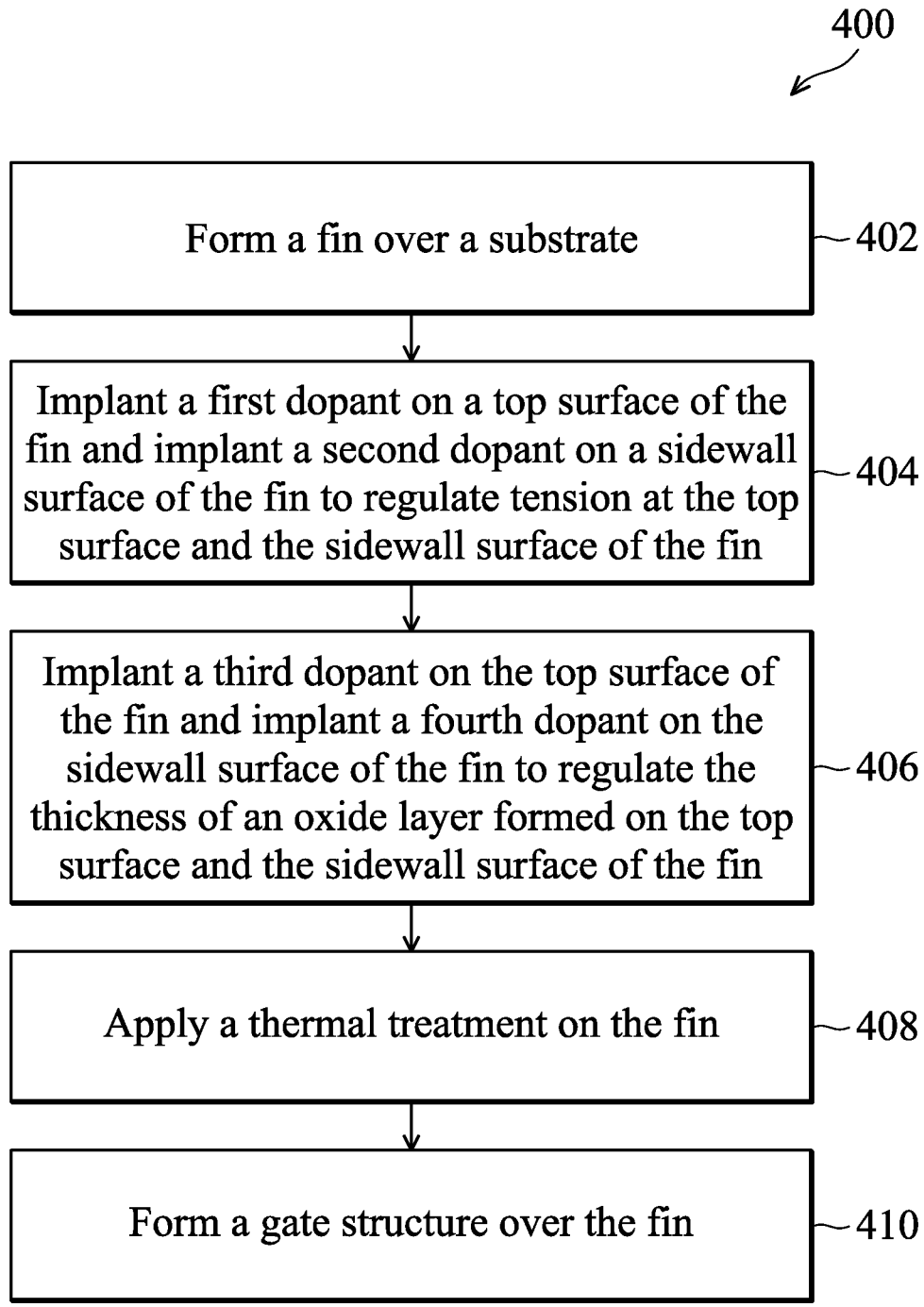
FIG. 4 is a flow chart of an exemplary method of fabricating a FinFET device, in accordance with some embodiments.

FIG. 4 is a flow chart of an exemplary method 400 of fabricating a FinFET device, in accordance with some embodiments. In block 402 of the method 400 and with reference to FIGS. 2A to 2D, a fin 106 is formed over a substrate 102. The fin 106 protrudes above and between isolation structures 104. The fin 106 has a top surface 106T and a sidewall surface 106S. There are a tension TS1 at the top surface 106T and a tension TS2 at the sidewall surface 106S of the fin 106. The tension TS1 is greater than the tension TS2 due to the different crystal orientations at the top surface 106T and the sidewall surface 106S of the fin 106.

In block 404 of the method 400 and with reference to FIGS. 2E and 2F, a first dopant 203 is implanted on the top surface 106T to regulate the tension TS1 into a tension TS3. The tension TS3 is less than the tension TS1. Also, a second dopant 205 is implanted on the sidewall surface 106S to regulate the tension TS2 into a tension TS4. The tension TS4 is greater than the tension TS2. After the implantations of the first dopant 203 and the second dopant 205 on the top surface 106T and the sidewall surface 106S of the fin 106, respectively, the tension TS3 at the top surface 106T and the tension TS4 at the sidewall surface 106S are uniform.

In block 406 of the method 400 and with reference to FIGS. 2G to 2I, a third dopant 207 is implanted on the top surface 106T and a fourth dopant 209 is implanted on the sidewall surface 106S to regulate the thickness of an oxide layer 108 formed on the top surface 106T and the sidewall surface 106S of the fin 106. After the implantations of the third dopant 207 and the fourth dopant 209 on the top surface 106T and the sidewall surface 106S of the fin 106, respectively, the thickness T1 of the oxide layer 108 on the top surface 106T and the thickness T2 of the oxide layer 108 on the sidewall surface 106S of the fin 106 are uniform.

In block 408 of the method 400 and with reference to FIG. 2H, a thermal treatment 210 is applied on the fin 106 to activate the first dopant 203, the second dopant 205, the third dopant 207 and the fourth dopant 209 on the top surface 106T and the sidewall surface 106S of the fin 106.

In block 410 of the method 400 and with reference to FIG. 2J or FIG. 3I, a gate structure 114 or 140 is formed over the fin 106. In some embodiments, the gate structure 114 includes the oxide layer 108 used as a gate dielectric layer, and a gate electrode layer 110 over the oxide layer 108. In some other embodiments, the gate structure 140 is a replacement gate structure including the oxide layer 108 used as an interfacial layer, the gate dielectric layer 126, the barrier layer 128, the work-function tuning layer 130 and the gate electrode layer 132.

Figure 5:
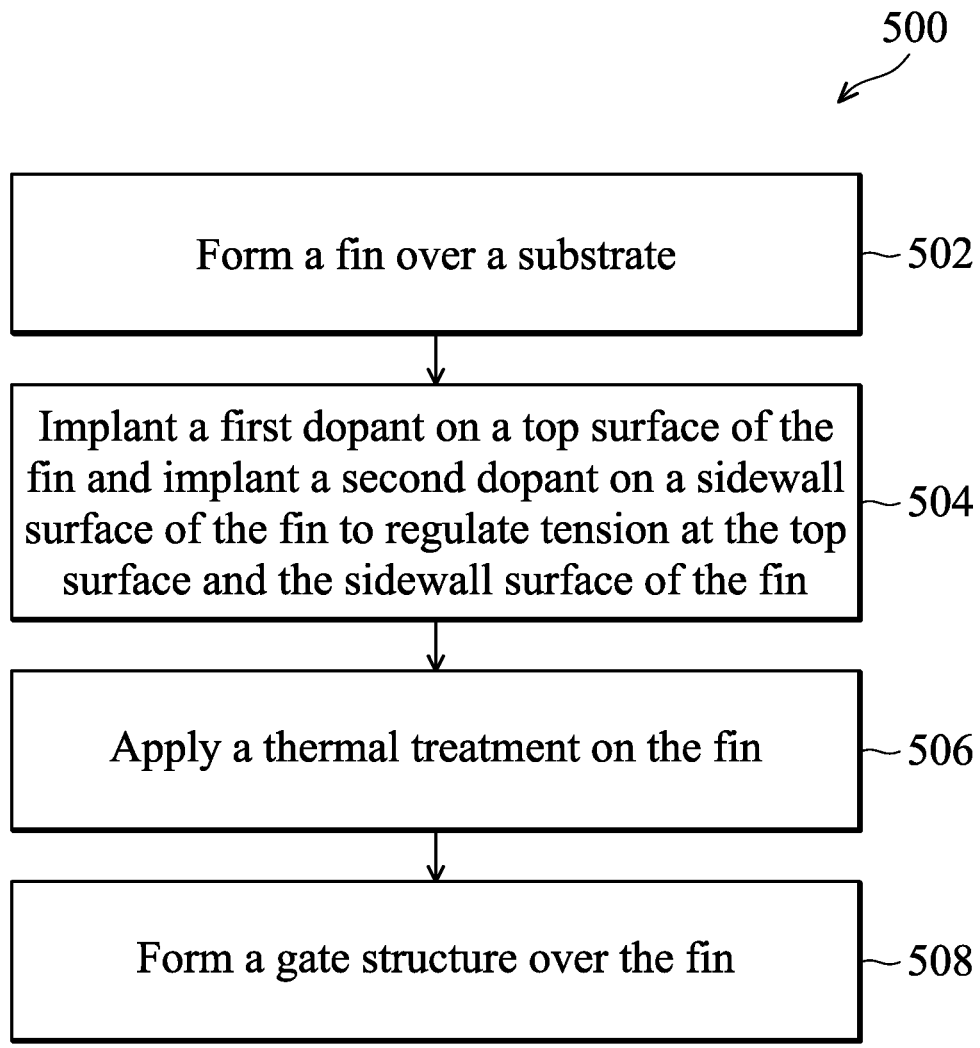
FIG. 5 is a flow chart of an exemplary method of fabricating a FinFET device, in accordance with some embodiments.

FIG. 5 is a flow chart of an exemplary method 500 of fabricating a FinFET device, in accordance with some embodiments. In block 502 of the method 500 and with reference to FIGS. 2A to 2D, a fin 106 is formed over a substrate 102. The fin 106 protrudes above and between isolation structures 104. The fin 106 has a top surface 106T and a sidewall surface 106S. There are a tension TS1 at the top surface 106T and a tension TS2 at the sidewall surface 106S. The tension TS1 is greater than the tension TS2.

In block 504 of the method 500 and with reference to FIGS. 2E and 2F, a first dopant 203 is implanted on the top surface 106T to regulate the tension TS1 into a tension TS3. The tension TS3 is less than the tension TS1. Also, a second dopant 205 is implanted on the sidewall surface 106S to regulate the tension TS2 into a tension TS4. The tension TS4 is greater than the tension TS2. After the implantations of the first dopant 203 and the second dopant 205 on the top surface 106T and the sidewall surface 106S of the fin 106, respectively, the tension TS3 at the top surface 106T and the tension TS4 at the sidewall surface 106S are uniform.

In block 506 of the method 500 and with reference to FIG. 2F, a thermal treatment 210 is applied on the fin 106 to activate the first dopant 203 at the top surface 106T and the second dopant 205 at the sidewall surface 106S of the fin 106.

In block 508 of the method 500 and with reference to FIG. 2J or FIG. 3I, a gate structure 114 or a replacement gate structure 140 is formed over the fin 106. The gate structure 114 and the replacement gate structure 140 may be the same as or similar to those described in block 410 of the method 400 and are not repeated herein.

Figure 6:
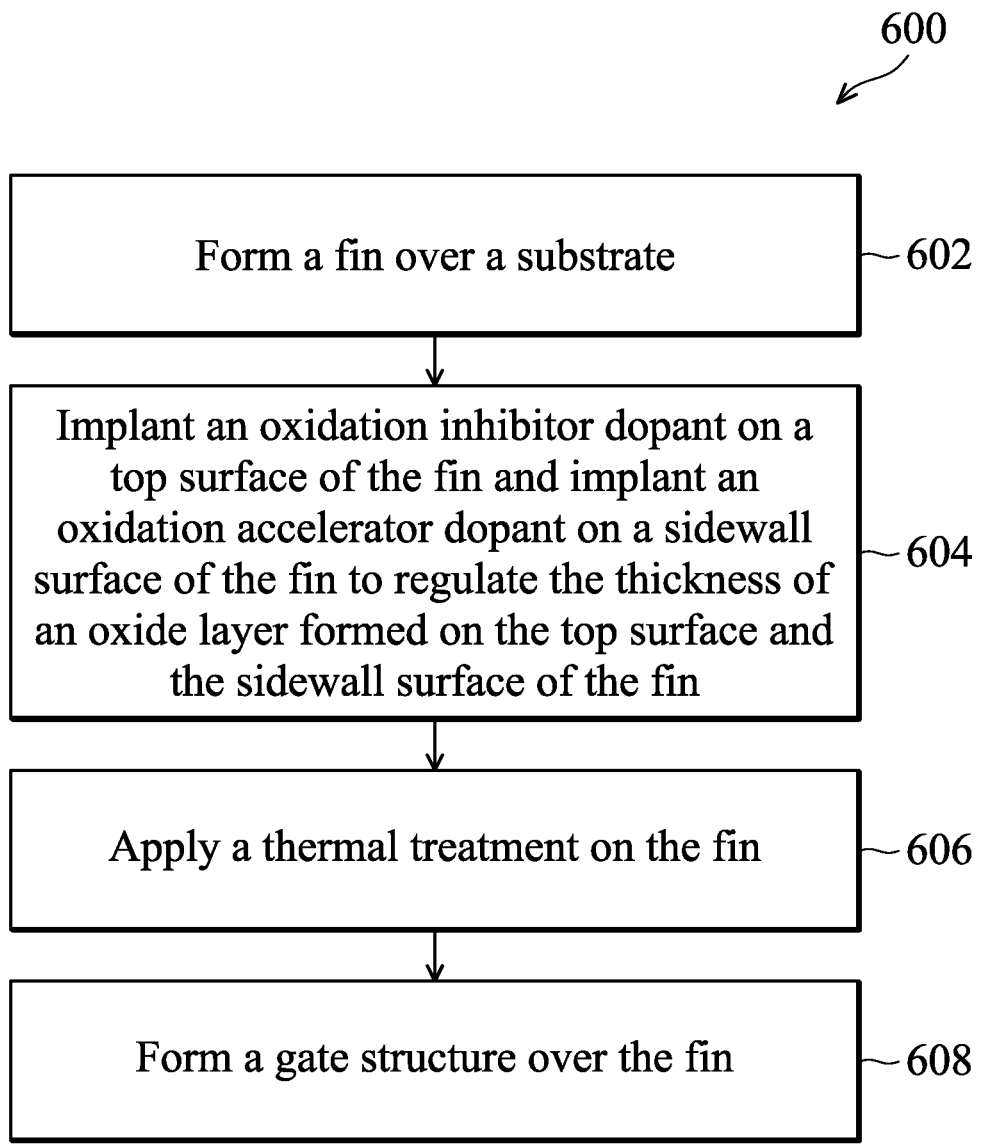
FIG. 6 is a flow chart of an exemplary method of fabricating a FinFET device, in accordance with some embodiments.

FIG. 6 is a flow chart of an exemplary method 600 of fabricating a FinFET device, in accordance with some embodiments. In block 602 of the method 600 and with reference to FIGS. 2A to 2D, a fin 106 is formed over a substrate 102. The fin 106 protrudes above and between isolation structures 104. The fin 106 has a top surface 106T and a sidewall surface 106S.

In block 604 of the method 600 and with reference to FIGS. 2G to 2I, a third dopant 207 used as an oxidation inhibitor dopant is implanted on the top surface 106T and a fourth dopant 209 used as an oxidation accelerator dopant is implanted on the sidewall surface 106S to regulate the thickness of an oxide layer 108 formed on the top surface 106T and the sidewall surface 106S of the fin 106. After the implantations of the third dopant 207 and the fourth dopant 209 on the top surface 106T and the sidewall surface 106S of the fin 106, respectively, the thickness T1 of the oxide layer 108 on the top surface 106T and the thickness T2 of the oxide layer 108 on the sidewall surface 106S of the fin 106 are uniform.

In block 606 of the method 600 and with reference to FIG. 2H, a thermal treatment 210 is applied on the fin 106 to activate the third dopant 207 and the fourth dopant 209 at the top surface 106T and the sidewall surface 106S of the fin 106.

In block 608 of the method 600 and with reference to FIG. 2J, a gate structure 114 or a replacement gate structure 140 is formed over the fin 106. The gate structure 114 and the replacement gate structure 140 may be the same as or similar to those described in block 410 of the method 400 and are not repeated herein.

The materials and the processes for forming various features as described in the methods 400, 500 and 600 may be the same as those described with respect to FIGS. 2A to 2J, and the details are not repeated herein.

According to some embodiments of the disclosure, the implantation 202 with the first dopant 203 is performed on the top surface 106T of the fin 106. The first dopant 203 has a smaller atomic radius than the material of the fin 106. The implantation 204 with the second dopant 205 is performed on the sidewall surface 106S of the fin 106. The second dopant 205 has a larger atomic radius than the material of the fin 106. The implantations 202 and 204 can regulate the tensions at top surface 106T and the sidewall surface 106S to be uniform. The uniform tension between the top surface and the sidewall surface of the fin can obtain well-controlled carrier mobility in the fin of the FinFET device. Therefore, the saturation current (Isat) and the threshold voltage (Vth) of the FinFET device can be well-controlled.

According to some embodiments of the disclosure, the implantation 206 with the third dopant 207 is performed on the top surface 106T of the fin 106. The third dopant 207 has the ability to inhibit oxidation of the fin 106 or the ability to inhibit oxide formation on the fin 106. The implantation 208 with the fourth dopant 209 is performed on the sidewall surface 106S of the fin 106. The fourth dopant 209 has the ability to accelerate oxidation of the fin 106 or the ability to accelerate oxide formation on the fin 106. The implantations 206 and 208 can regulate the thickness of the oxide layer formed on the top surface 106T and the sidewall surface 106S to be uniform. The uniform thickness of the oxide layer between the top surface and the sidewall surface of the fin can obtain well-controlled breakdown voltage of the FinFET device and reduce leakage current of the FinFET device. Therefore, the reliability of the FinFET device is improved.

In some embodiments, a method of fabricating a FinFET device is provided. The method includes forming a fin over a substrate. The method also includes implanting a first dopant on the top surface of the fin, and implanting a second dopant on the sidewall surface of the fin. The first dopant is different from the second dopant. The method further includes forming an oxide layer on the top surface and the sidewall surface of the fin. In addition, the method includes forming a gate electrode layer over the oxide layer.

In some embodiments, a method of fabricating a FinFET device is provided. The method includes forming a fin over a substrate. The method also includes implanting an oxidation inhibitor dopant on the top surface of the fin, and implanting an oxidation accelerator dopant on the sidewall surface of the fin. The method further includes forming an oxide layer on the top surface and the sidewall surface of the fin, and forming a gate electrode layer over the oxide layer. In addition, the method includes forming a source region and a drain region in the fin and at opposite sides of the gate electrode layer.

In some embodiments, a FinFET device is provided. The FinFET device includes a fin protruding from a semiconductor substrate. The FinFET device also includes an oxide layer conformally on the top surface and the sidewall surface of the fin. The FinFET device further includes a gate electrode layer over the oxide layer. In addition, the FinFET device includes a source region and a drain region in the fin and at opposite sides of the gate electrode layer. The fin has a first portion located at the top surface of the fin and a second portion located at the sidewall surface of the fin. The first portion contains a first dopant, and the second portion contains a second dopant that is different from the first dopant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a Fin Field Effect Transistor (FinFET) device, comprising:
    forming a fin over a substrate;
    implanting a first dopant on a top surface of the fin;
    implanting a second dopant on a sidewall surface of the fin, wherein the first dopant is different from the second dopant;
    forming an oxide layer on the top surface and the sidewall surface of the fin, wherein the oxide layer is formed using a thermal oxidation process, and the first dopant and the second dopant in the fin are activated by the thermal oxidation process; and
    forming a gate electrode layer over the oxide layer.

2. The method as claimed in claim 1, wherein the fin includes silicon and the first dopant has an atomic radius that is smaller than the atomic radius of silicon, and the first dopant comprises carbon (C), nitrogen (N), boron (B) or a combination thereof.

3. The method as claimed in claim 1, wherein the fin includes silicon and the second dopant has an atomic radius that is larger than the atomic radius of silicon, and the second dopant comprises germanium (Ge), tin (Sn), indium (In), gallium (Ga), arsenic (As) or a combination thereof.

4. The method as claimed in claim 1, further comprising, before forming the oxide layer, applying a thermal treatment to activate the first dopant and the second dopant in the fin.

5. The method as claimed in claim 1, further comprising:
    forming a source region and a drain region in the fin and at opposite sides of the gate electrode layer.

6. The method as claimed in claim 1, before forming the oxide layer, further comprising:
    implanting a third dopant on the top surface of the fin; and
    implanting a fourth dopant on the sidewall surface of the fin, wherein the fourth dopant is different from the first dopant, the second dopant and the third dopant, and the third dopant is different from the second dopant.

7. The method as claimed in claim 6, wherein the third dopant has an ability to inhibit oxidation of the fin, and the third dopant comprises nitrogen (N), carbon (C) or a combination thereof.

8. The method as claimed in claim 6, wherein the fourth dopant has an ability to accelerate oxidation of the fin, and the fourth dopant comprises oxygen (O).

9. The method as claimed in claim 6, wherein the first dopant and the third dopant are respectively implanted on the top surface of the fin at a tilt angle of about 0 degrees between a normal direction of the substrate and an implantation direction.

10. The method as claimed in claim 6, wherein the second dopant and the fourth dopant are respectively implanted on the sidewall surface of the fin at a tilt angle of about 15 degrees to about 40 degrees between a normal direction of the substrate and an implantation direction.

11. The method as claimed in claim 6, further comprising, before forming the oxide layer, applying a thermal treatment to activate the third dopant and the fourth dopant in the fin.

12. The method as claimed in claim 6, wherein the third dopant and the fourth dopant in the fin are activated by the thermal oxidation process.

13. The method as claimed in claim 1, wherein the first dopant has an ability to reduce a tension of the fin, and the second dopant has an ability to increase a tension of the fin.

14. A method of fabricating a Fin Field Effect Transistor (FinFET) device, comprising:
    forming a fin over a substrate;
    implanting an oxidation inhibitor dopant on a top surface of the fin;
    implanting an oxidation accelerator dopant on a sidewall surface of the fin, wherein the oxidation accelerator dopant comprises oxygen (O);
    forming an oxide layer on the top surface and the sidewall surface of the fin;
    forming a gate electrode layer over the oxide layer; and
    forming a source region and a drain region in the fin and at opposite sides of the gate electrode layer.

15. The method as claimed in claim 14, wherein the oxidation inhibitor dopant comprises nitrogen (N), carbon (C) or a combination thereof, and the oxidation inhibitor dopant is implanted on the top surface of the fin at a tilt angle of about 0 degrees between a normal direction of the substrate and an implantation direction.

16. The method as claimed in claim 14, wherein the oxidation accelerator dopant is implanted on the sidewall surface of the fin at a tilt angle of about 15 degrees to about 40 degrees between a normal direction of the substrate and an implantation direction.

17. The method as claimed in claim 14, further comprising, before forming the oxide layer, applying a thermal treatment to activate the oxidation inhibitor dopant and the oxidation accelerator dopant in the fin.

18. A method of fabricating a Fin Field Effect Transistor (FinFET) device, comprising:
   forming a fin over a substrate;
   implanting a tension reduction dopant on a top surface of the fin;
   implanting a tension increase dopant on a sidewall surface of the fin;
   applying a first thermal treatment to activate the tension reduction dopant and the tension increase dopant in the fin;
   implanting an oxidation inhibitor dopant on the top surface of the fin;
   implanting an oxidation accelerator dopant on the sidewall surface of the fin;
   applying a second thermal treatment to activate the oxidation inhibitor dopant and the oxidation accelerator dopant in the fin;
   forming an oxide layer on the top surface and the sidewall surface of the fin; and
   forming a gate electrode layer over the oxide layer.

19. The method as claimed in claim 18, wherein a first tension on the top surface of the fin is greater than a second tension on the sidewall surface of the fin before implanting the tension reduction dopant and the tension increase dopant.

20. The method as claimed in claim 18, wherein a first tension on the top surface of the fin and a second tension on the sidewall surface of the fin are substantially uniform after implanting the tension reduction dopant and the tension increase dopant.

* * * * *